United States Patent [19]

Johnson et al.

[11] Patent Number: 4,776,804
[45] Date of Patent: Oct. 11, 1988

[54] CIRCUIT BOARD SYSTEMS, CONNECTORS USED THEREIN, AND METHODS FOR MAKING THE CONNECTORS AND SYSTEMS

[75] Inventors: Larry K. Johnson, North Attleboro; Austin S. O'Malley, Rehoboth; Robert M. Fife, Attleboro; Walter L. Walas, Rehoboth, all of Mass.; Robert K. Peterson, Garland, Tex.; Larry J. Mowatt, Allen, Tex.; Maurice M. Guy, Garland, Tex.

[73] Assignee: Texas Instruments Incorporated, Dallas, Tex.

[21] Appl. No.: 12,703

[22] Filed: Feb. 5, 1987

[51] Int. Cl.$^4$ ............................................. H01R 9/09
[52] U.S. Cl. ..................................... 439/62; 29/840; 439/79; 439/384; 439/572; 439/892
[58] Field of Search ............................ 439/55, 59–62, 439/65, 78–80, 384, 385, 571, 572, 892; 29/839, 840, 841, 739–741

[56] References Cited

U.S. PATENT DOCUMENTS

| | | | |
|---|---|---|---|
| 3,587,029 | 6/1971 | Knowles | 439/62 |
| 4,585,285 | 4/1986 | Martens | 439/62 |
| 4,628,410 | 12/1986 | Goodman et al. | 361/413 |
| 4,639,056 | 1/1987 | Lindeman et al. | 29/841 |
| 4,660,911 | 4/1987 | Reynolds et al. | 439/79 |

FOREIGN PATENT DOCUMENTS

| | | | |
|---|---|---|---|
| 1364127 | 5/1964 | France | 439/79 |
| 2093641 | 9/1982 | United Kingdom | 439/891 |

*Primary Examiner*—Neil Abrams
*Attorney, Agent, or Firm*—James P. McAndrews; John A. Haug; Mel Sharp

[57] ABSTRACT

A circuit board system resiliently mounts a plurality of daughter boards with high circuit interconnection density on a mother board using pairs of mating connectors having welded contact members accommodated in novel arrangements in the respective connectors to permit high density of electrical interconnection with convenience and reliability

26 Claims, 9 Drawing Sheets

CIRCUIT BOARD SYSTEMS, CONNECTORS USED THEREIN, AND METHODS FOR MAKING THE CONNECTORS AND SYSTEMS

BACKGROUND OF THE INVENTION

The field of this invention is that of circuit board systems and the invention relates more particularly to improving the density with which a plurality of first circuit board units or daughter boards are reliably mounted and electrically interconnected to a second circuit board or mother board.

Conventional circuit board systems which mount a plurality of first circuit board or daughter board units on a second, larger circuit board or mother board have been limited with respect to the density with which they have been able to accommodate the daughter boards on the mother board without introducing problems of expense, inconvenience or loss of interconnection reliablity. It is possible to achieve relatively high circuit path densities on individual circuit board units where appropriate procedures are followed, but problems of mechanical and electrical interconnection between circuit boards has tended to limit the use of mother board-daughter board systems to systems having a relatively limited number of connector pins with a minimum of 0.100 inch spacing between connector pins on the mother board.

BRIEF SUMMARY OF THE INVENTION

It is an object of this invention to provide a novel and improved circuit board system; to provide such a novel and improved system having a plurality of first circuit board units mounted and electrically interconnected with high interconnection density on a second larger circuit board unit; to provide novel and improved connectors for use with economy, convenience and reliability in such systems; and to provide novel and improved methods for making such connectors and systems.

Briefly described, the novel and improved circuit board system of this invention incorporates edgeboard connectors having leaf springs extending from the connector contacts to electrically engage circuit path terminal pads along both sides of an edge of first circuit or daughter board units which are mounted in the respective edgeboard connectors. The edgeboard connectors utilize welded contact members to achieve a novel and improved combination of strength, size, resilience and compactness, the welded contact members being compactly accommodated with novel spacing arrangements in the edgeboard connectors to reliably position the leaf springs in closely spaced relation while also providing contact posts extending from the edgeboard connectors in a manner permitting secure and reliable connection to the mating contact members in second or mother board connectors. The leaf springs are typically arranged in very closely spaced relation to each other on 0.025 inch centers for example for accommodating as many as 344 terminal pad connections on each first circuit board unit.

The second connectors also utilize novel welded contact members of another construction and are also compactly accommodated with novel spacing arrangements in the second connectors to make secure and reliable connection to the mating contact post of the edgeboard connectors while also providing contact posts which extend from the second connectors to be received in rectilinearly arranged rows and ranks of mounting apertures on the mother board, thereby to permit high density arrangement of circuit paths to connect to the contact posts or to extend between the apertures on the mother board.

The edgeboard connectors incorporated several novel features including novel arrangements for interfitting contact leaf springs with each other and novel means for adjusting positioning of the leaf spring relative to the daughter boards to assure convenient, secure and reliable soldering of the leaf springs to the closely spaced terminal pads on the daughter boards. The mother board connectors also incorporate several novel features including novel resilient mounting, long contact post or terminal extensions with special conditioning of contact post materials, use of improved polarity and guide means, and novel organizing of the distal ends of the extending contact posts to facilitate proper insertion, soldering and support of the connector contact posts in mother board mounting apertures. The contact members used in the mother board and daughter board connectors are preferably blanked and welded in novel sets of interfitting welded contact strip structures and are inserted into novel arrangements of contact member mounting openings in the bodies of the connector to facilitate convenient and reliable manufacture of the connectors. The connectors are also mounted and/or adjusted relative the the mother and daughter boards in novel ways to be properly soldered to circuit paths on those boards in a convenient, ecomonical and reliable manner.

DESCRIPTION OF THE DRAWINGS

Other objects, advantages and special features and details of the novel and improved circuit board systems, connectors and methods of this invention appear in the following detailed description of preferred embodiments of the invention, the detailed description referring to the drawings in which.

DESCRIPTION OF THE PREFERRED EMBODIMENTS

Figure 1:
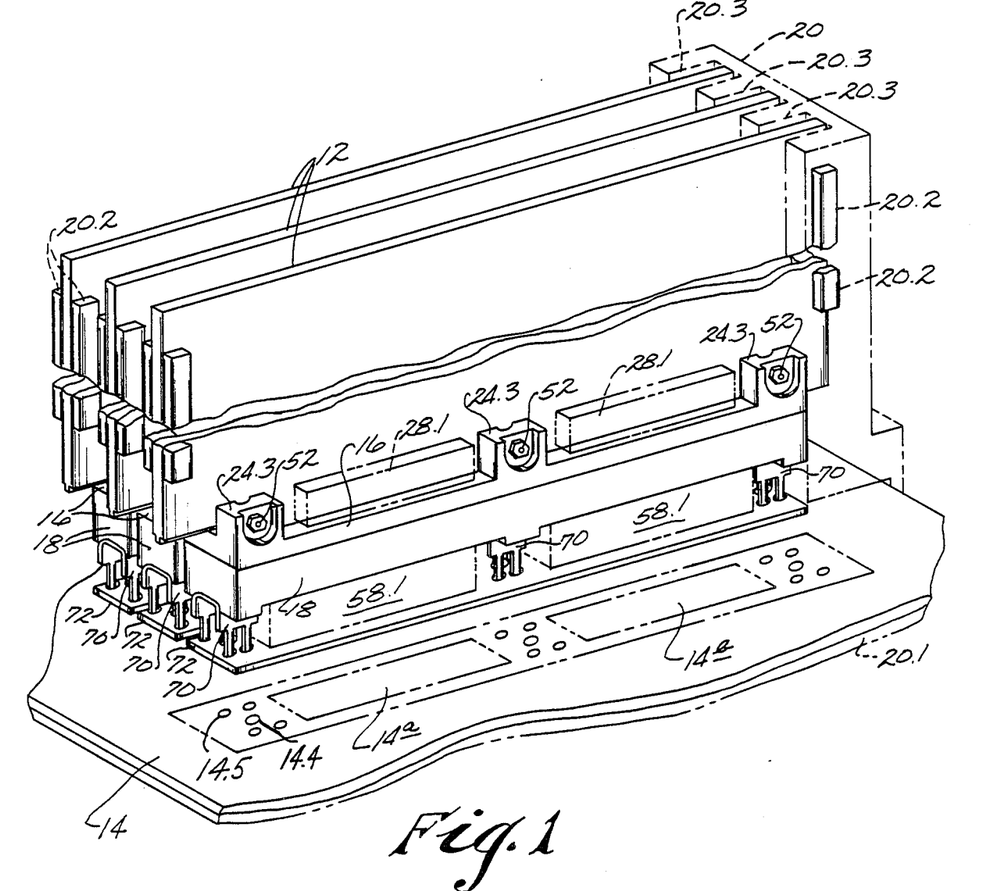
FIG. 1 is a perspective view of the novel and improved circuit board system of this invention.

Referring to the drawings, 10 in FIG. 1 indicates the novel and improved circuit board system of this invention which is shown to include a plurality of first circuit board units 12 mounted on a second circuit board 14 by use of pairs of mating connectors including first connectors 16 of the edgeboard type which are intitially attached and electrically connected to the respective first circuit boards 12 and the second connectors 18 which are intitially attached and electrically connected to the second circuit board 14 at selected locations on the second board, the first and second connectors then being detachably fitted together for mounting the first boards on the second board and for electrically interconnecting first circuit board circuit paths in an electrial circuit on the second board. In preferred embodiments of the circuit board system, the second circuit board is mounted in a heat-dissipating rack means or the like as is diagrammatically illustrated by the broken lines 20 in FIG. 1. For example, the second board is typically attached to such a rack means over a heat-dissipating metal floor member 20.1 by screw means or the like, and the first circuit board units, each having conventional heat-dissipating flanges 20.2 thereon, are inserted into the rack means 20 along tracks 20.3 as the connectors 16 and 18 are mated so that the flanges are engaged in heat-transfer relation with the rack means for rapidly withdrawing and dissipating heat from the circuit board system 10. If desired, seating and ejecting levers and the like (not shown) are attached to the first circuit boards in conventional manner for engaging the rack means 20 or the like to assist in seating the first edgeboard connectors in the second connectors or in withdrawing the first connectors from the second connectors in conventional manner. As the arrangement and use of such heat-dissipating rack means and lever means are conventional, they are not further described herein and it will be understood that the circuit board system 10 of this invention is adapted for use with any of such conventional heat-dissipating means or seating or ejection means.

Figure 2:
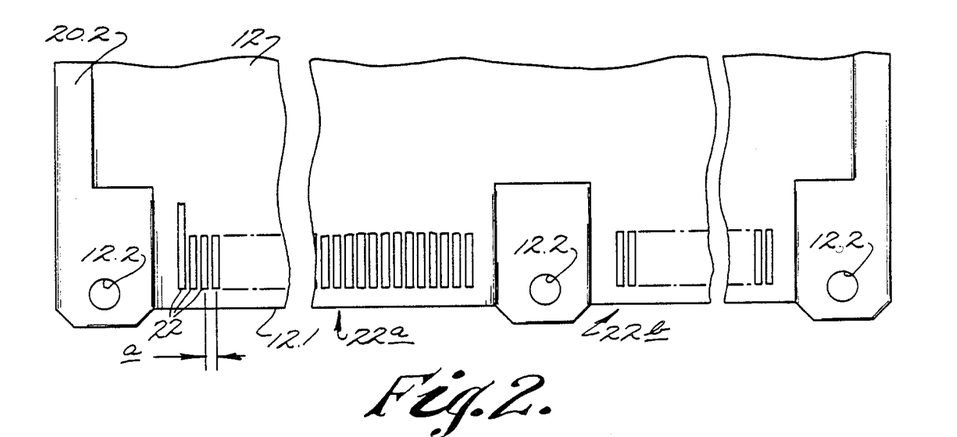
FIG. 2 is a partial plan view to enlarged scale of a portion of a first circuit board used in the system of FIG. 1 illustrating terminal pads of an electrical circuit provided on the first circuit board.

In accordance with this invention, each of the first circuit board units 12 is of generally conventional design incorporating circuit components (not shown) mounted on circuit paths in conventional manner wherein the circuit paths terminate in a plurality of terminal pads 22 arranged in spaced relation to each other along an edge 12.1 of the circuit board as illustrated in FIG. 2. In preferred embodiments, the rows of terminal pads extend along each of two opposite sides of that circuit board edge (see FIG. 6) in very closely spaced center-to-center relation a to each other for permitting large numbers of the terminal pads to be accommodated on each first board as may be desired. Typically for example, the terminal pads are spaced on 0.025 inch centers on each of two sides of each first circuit board in two groups 22a, 22b of 86 pads each along the common edge 12.1 for accommodating a total of 344 terminal pads on each first circuit board, the board having mounting holes 12.2 spaced relative to the terminal pad groups as shown.

Figure 3:
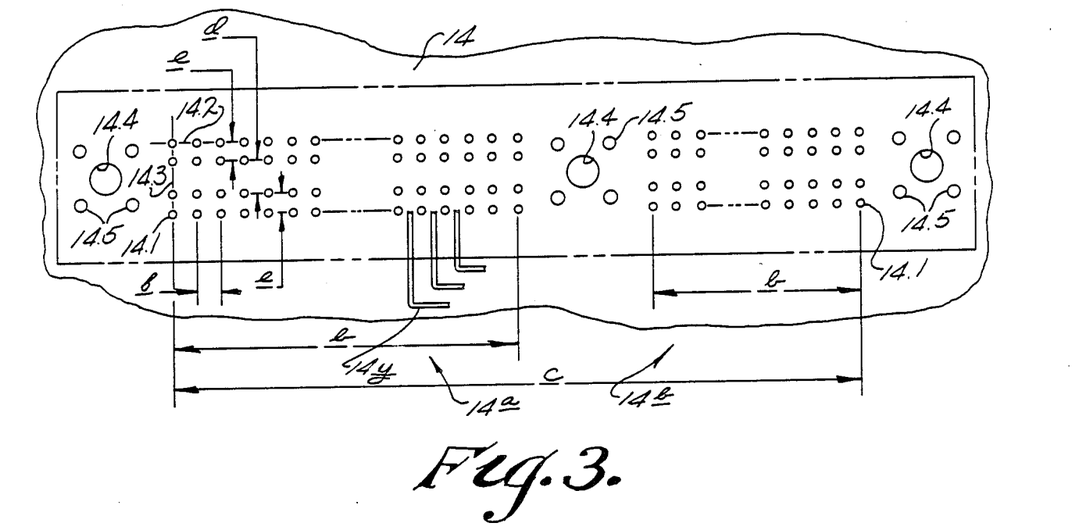
FIG. 3 is a partial plan view to enlarged scale of a portion of a second circuit board used in the system of FIG. 1 diagrammatically illustrating mounting apertures and circuit paths provided on the second circuit board.
Figure 4:
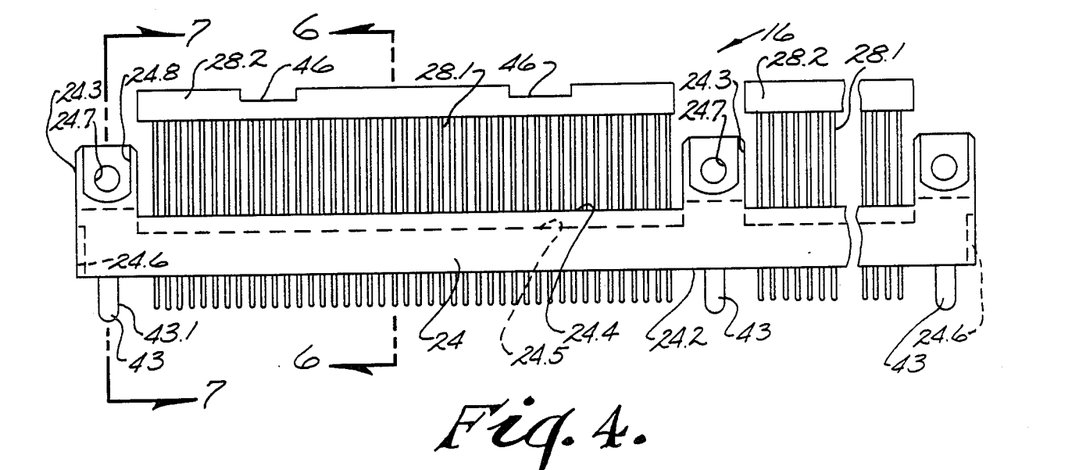
FIG. 4 is a side elevation view to enlarged scale of a first edgeboard connector used in the system of FIG. 1.

In accordance with this invention, the second circuit board is also of generally conventional design. Preferably the second circuit board 14 has contact post apertures 14.1 which are rectilinearly arranged on rows 14.2 and ranks 14.3 as shown in FIGS. 1 and 3 for receiving contact posts from the second connectors 18 as will be described below. That rectilinear arrangement of the mounting apertures in the second circuit board is known to be desirable for best accommodating large numbers of circuit paths (as diagrammatically illustrated at 14y in FIG. 3) either for connection of connector contact posts in the apertures to the circuit paths or for permitting convenient passage of other circuit paths on the board between the apertures. In a preferred embodiment, the circuit board 14 provides 344 contact post apertures 14.1 for each of the second connectors 18 to be mounted thereon, the apertures being arranged in two groups 14a, 14b each with 4 rows of 43 apertures each having a length b of of 2.1 inches for each group, a total length c of 4.575 inches for the two groups, a spacing d of 0.125 inches between the central pairs of rows, a spacing e of 0.075 inches between the outer pairs of rows, and a spacing f of 0.050 inches between adjacent apertures in each row. In that way, the second circuit board is adapted to receive first circuit board units thereon with significantly increased density of circuit interconnection lines as described below. Preferably the second circuit board also includes three groups of guide holes 14.4 with 4 associated mounting holes 14.5 to be further described below.

Figure 5:
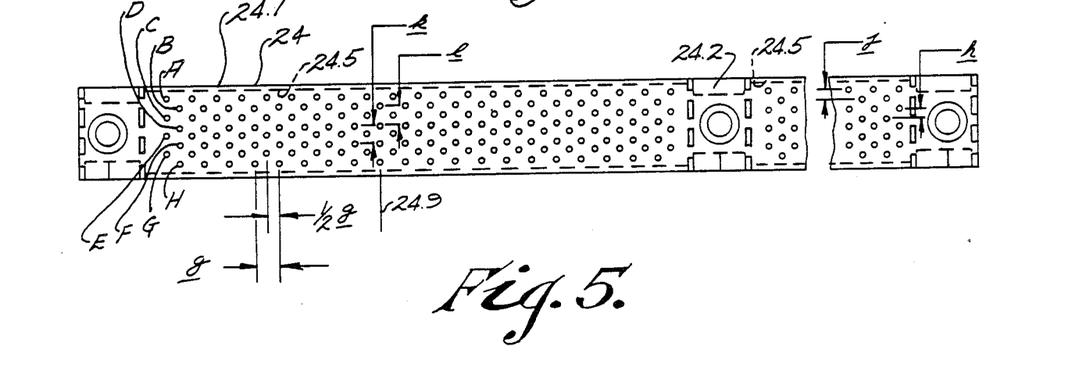
FIG. 5 is a bottom view of the insulating body used in the first connector shown in FIG. 4.
Figure 6:
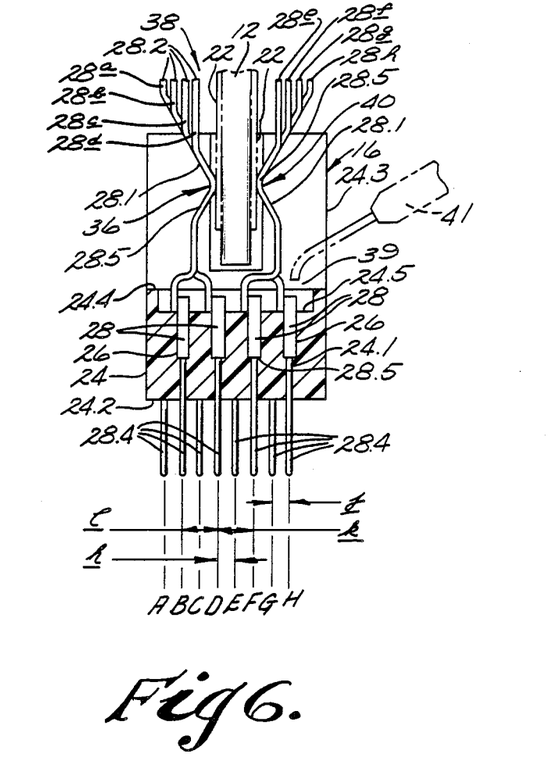
FIG. 6 is a section view along line 6—6 of FIG. 4.
Figure 7:
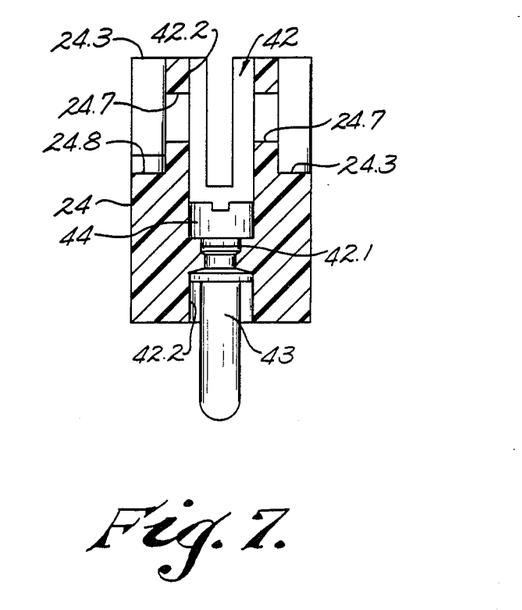
FIG. 7 is a section view along line 7—7 of FIG. 4.

In accordance with this invention, each of the first 30 connectors 16 shown in FIGS. 4–7 is of the edgeboard type and has a body 24 of relatively rigid, electrical insulating material such as glass-filled nylon or polycarbonate or glass-filled polyphenylene material sold under the trade name Ryton or the like. The body has a plurality of rows of openings 24.1 arranged with the openings in alternate ones of the rows offset along the length of the body relative to corresponding openings in adjacent rows. Preferably the connector body has a bottom 24.2, mounting bosses 24.3 spaced along the top 24.4 of the body, a pair of shallow wells 24.5 spaced in the top of the body, recesses 24.6 formed in the ends of the body, mounting holes 24.7 in the mounting bosses, and recesses 24.8 in the bosses aligned with the mounting holes. The openings 24.1 extend through the body from the top to the bottom of the body and are preferably arranged in eight rows A-H as shown in FIG. 5 to have 43 openings in each row with a first center-to-center spacing g of 0.100 inches between adjacent openings in each row. If desired, each row of openings is divided into a pair of groups or sections of 22 and 21 openings respectively accommodated in one of the wells 24.4 as shown in FIG. 5. The openings in alternate rows are preferably offset by one-half of said first center-to-center spacing relative to the corresponding openings in adjacent rows. In one preferred embodiment, there is a spacing h of 0.050 inches between two groups of four of the rows of openings and a spacing j of 0.0375 inches between the rows of openings in each group. In that arrangement, there is a spacing k of 0.0875 inches between the center openings in each rank 24.9 of four openings with a spacing 1 of 0.075 inches between the other pairs of openings in each rank so there is uniform center-to-center spacing between the openings 24.1 in each of said groups, and there are 344 openings very compactly accommodated with that desirable spacing in two groups in the connector body. Of course, the body is also provided with other numbers of openings as may be desired in accordance with this invention. Preferably each opening has a part of relatively larger diameter or cross section near the top of the body forming a shoulder 26 in each opening facing toward the top of the body as shown in FIG. 6.

A plurality of contact members 28 (see FIGS. 8A-8B) are mounted in the respective openings 24.1 in the connector body 24 to form the daughter board connector 16. In accordance with this invention, the contact members have first connection means such as contact posts arranged in rows at one end of the members with one center-to-center spacing between the first connection means in those rows while other connection means such as leaf springs are provided at opposite ends of the members to extend from the openings to be disposed in more compact relation in a lesser number of other rows with relatively smaller center-to-center spacing between the other connection means in those other rows. Preferably the contact members are of welded construction to be accommodated in such compactly arranged connector body openings while also combining desired strength, resilience and size characteristics and the like in the contact members to assure proper connection to mating contact means.

Figure 8A:
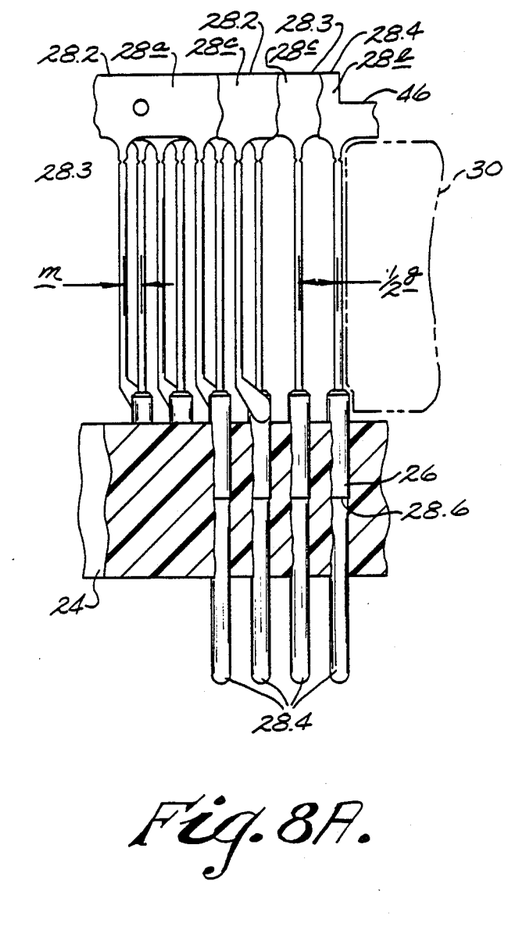
FIG. 8A is a partial side elevation view similar to FIG. 4 to greatly enlarged scale and partly in section illustrating the blanking and mounting of a plurality of strips of contact members in the connector of FIG. 4.
Figure 8B:
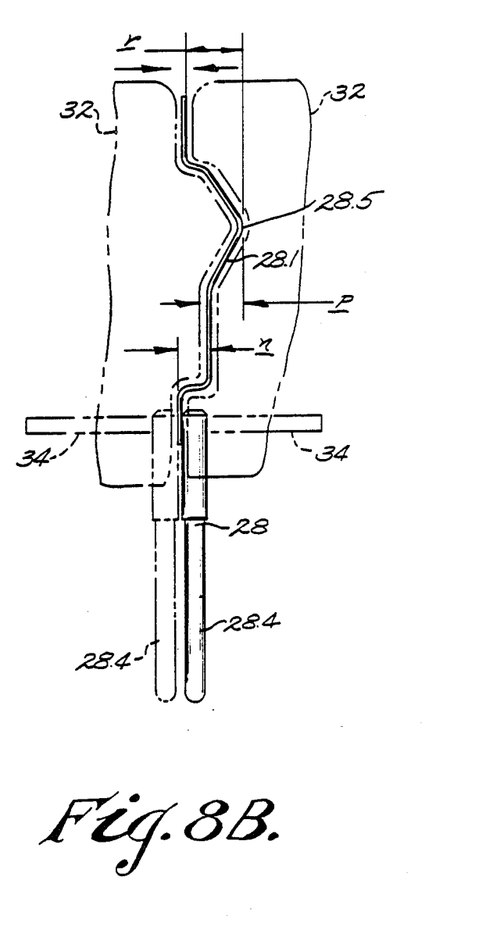
FIG. 8B is a side elevation view of one of the strips of contact members of FIG. 8A illustrating forming and welding of the contact members in the strip.
Figure 9:
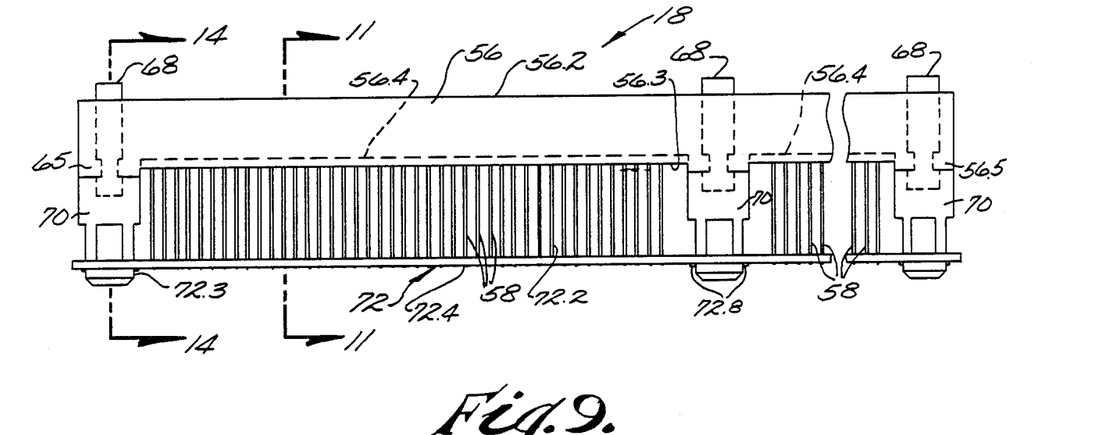
FIG. 9 is a side elevation view enlarged scale of a second connector used in the system of FIG. 1.

In a preferred embodiment, a plurality of the contact members 28 are formed in interconnected relation to each other by blanking or etching or otherwise shaping first, leaf spring, connection means 28.1 from a strip of resilient, electrically conductive metal spring material such as beryllium copper, phosphor bronze or the like to have the distal ends of the leaf springs interconnected by a carrier portion 28.2 of the strip. The leaf springs preferably have weakened portions 28.3 of relatively smaller cross section between the carrier strip portion and each of the individual leaf springs for permitting subsequent separation of the carrier strip portion from the leaf spring. The blanking or other shaping of the leaf spring strips is carried out by any conventional means as is diagrammatically indicated by the broken lines 30 in FIG. 8A. The blanked, etched or otherwise formed strip of leaf springs is then shaped by any conventional means as is diagrammatically indicated by the broken lines 32 in FIG. 8B to provide the leaf springs with selected leaf spring bend or offset configuration. Second contact-post connection means 28.4 formed of a relatively more rigid, electrically conductive metal material such as brass or the like of substantial size and relatively thicker than the leaf spring strip metal material as shown in FIG. 8B are then secured to the opposite ends of the leaf springs 28.1 by resistance welding means or the like as is diagrammatically indicated by the broken lines 34 in FIG. 8B. Alternately the contact posts are secured to the leaf springs by brazing, soldering, crimping or in other conventional manner. The contact members are then heat-treated in conventional manner to provide the leaf springs 28.1 with desired spring characteristics. In accordance with this invention, a plurality of such strips of contact members having said first center-to-center spacing in each strip are disposed in respective rows of openings in the connector body 24 with the contact members in each strip disposed in respective openings in each row so that the leaf springs extend from the openings and are disposed in interfitting relation to each other with contact portions thereof positioned in a common row with a relatively much smaller center-to-center spacing between the contact portions of the leaf springs in the common row.

Preferably for example a plurality of contact member strips 28a, 28b, 28c and 28d having leaf springs 28.1 with 0.100 inch center-to-center spacing in each strip are inserted into rows A, B, C and D respectively of openings in the connector body where the connector body openings are spaced on corresponding 0.100 inch centers, thereby to form the connector 16. The shoulders 28.6 on the contact posts are rested on the shoulders 26 in the openings so that leaf springs extend from the top of the connector body. The leaf springs in two of the strips 28a, 28b have L-shaped sections with an offset of m of 0.025 inches as viewed in FIG. 8A, thereby to cooperate with the offset of the openings in the connector body rows to dispose contact portions 28.5 of the leaf springs from all four of the strips in a commom row 36 as indicated in FIG. 8A with the relatively very small center-to-center spacing of 0.025 inches between the leaf springs in the common row. Preferably one set of those strips 28a, 28c has its contact posts welded to one side of the leaf springs while the other set of contact posts 28b, 28d are welded to the opposite spring sides as viewed in FIG. 8A. The leaf springs are also blanked with varying offsets n, p and r so that when the strips of contact members are positioned in the respective rows of openings A, B, C and D adjacent one side of the connector body, the contact portions 28.5 formed on the leaf springs are all disposed in the common row 36 as viewed in FIG. 6 while the carrier strip portions 28.2 of the strips are disposed in spaced, somewhat nested relation to each other as indicated at 38 in FIG. 6. In a preferred embodiment, a comparable set of contact strips 28e, 28f, 28g and 28h are disposed in oppositely facing orientation in another group of rows connector body openings E, F, G, H for disposing contact portions 28.5 of those contact members in another common row 40 spaced from the common row 36 as shown in FIG. 6. Where each of the rows A-H of contact openings is divided into two sections or groups in the respective wells 24.4 in the top of the connector body as shown, each of the strips of contact members 28a-28h is divided into two sections of 22 and 21 contact members respectively to be inserted into respective portions of the rows A-H as will be understood. It will also be understood that continuous strips of the contact members may be formed and cut to length as desired.

After the strips of contact members are disposed in the connector body openings as described, an epoxy sealing and securing means is preferably introduced into each body well 24.5 from dispenser means or the like as diagrammatically indicated by broken lines 41 in FIG. 6 for securing and sealing the contact members 28 in the respective body openings.

In a preferred embodiment, each of the connector bodies 24 has guide pin holes 42 therein, at the mounting boss locations for example, and has shaped guide pins 43 held therein by threaded screw means 44 engaged with the pins for clamping a connector body portion 42.1 therebetween. Preferably each body guide pin hole 42 has a larger diameter portion 42.2 at the bottom of the connector body and at least one of the pins preferably has a flat 43.1 thereon to serve as a polarizing means as desribed below.

In a preferred embodiment, the carrier strips 28.2 in the noted strips 28a–28h of the contact members have locating notches 46 therein which are positioned so that the notches in groups 28a–28d and 28e–28g of the strips are normally aligned when the strips of contact members are mounted in the connector body openings for interfitting with each other as above described. However if the leaf springs of one of the strips should be misaligned relative to the leaf springs of the other strips, that strip is adapted to be engaged in the noted notch for adjusting the alignment of the leaf springs of that strip with the other leaf springs.

Figure 20:
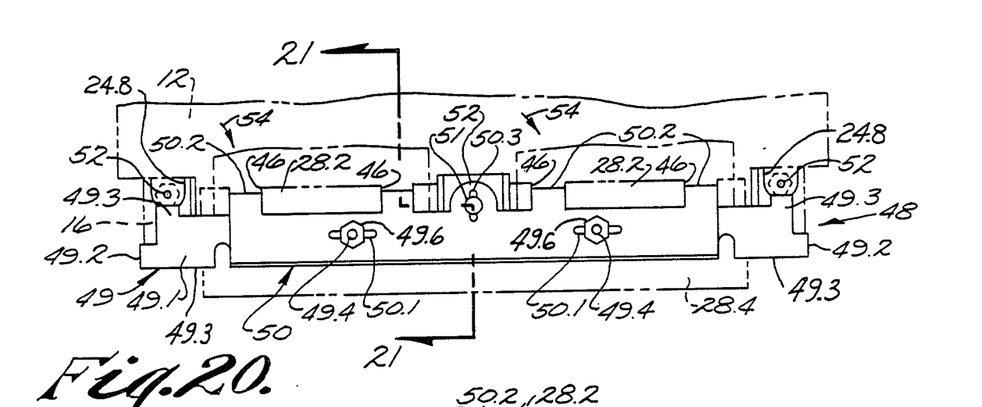
FIG. 20 is a front elevation view illustrating an adjusting device for positioning leaf springs of the edgeboard connector of FIG. 4 in alignment with terminal pads of the first circuit boad of FIG. 2 during soldering thereof.
Figure 21:
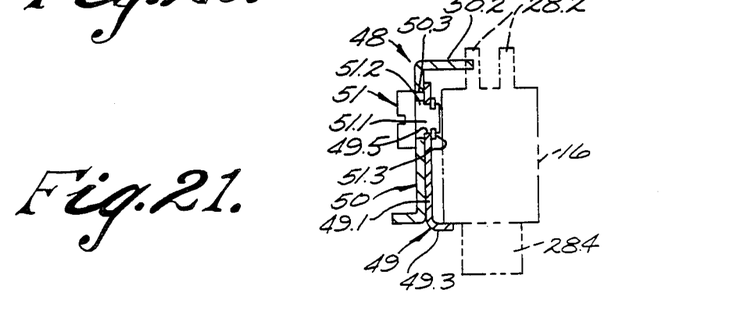
FIG. 21 is a section view along line 21—21 of FIG. 20 to enlarged scale.

In accordance with this invention, temporary adjusting fixtures 48 are preferably provided for use during mounting a connector 16 on a first circuit board or daughter board 12 as shown in FIGS. 20 and 21 to assure the leaf springs 28.1 are precisely adjusted to engage respective terminal pads 22 on the daughter boards before the springs are soldered to the pads, the fixture then being removed to lead the springs attached to the daughter boards as shown in FIG. 1. In that fixture, an inner mounting bracket 49 has a front piece 49.1 adapted to lie along a front side of the connector body 24 and has stiffly resilient, bent flange ends 49.2 which slip over the ends of the connector body into the respective recesses 24.6 thereon for detachably attaching the fixture to the connector 16 in a temporary manner. If desired additional bent flanges 49.3 are adapted to fit over the edges of the top and bottom of the connector body as by fitting into recesses 24.8 as shown in FIG. 20 and by fitting under the body of the connector 16 as shown in FIG. 21. Threaded studs 49.4 are welded or otherwise secured to the mounting bracket to extend out from the bracket as viewed in FIG. 20 and an adjusting-cam journal-opening 49.5 is provided in the mounting bracket. A movable adjusting member 50 on the fixture 48 has slots 50.1 fitted over the threaded studs 49.4, has bent flanges 50.2 adapted to fit into the locating notches 46 in the strips 28.2 of contact members in the connector, and has an additional cam follower slot 50.3 aligned with the journal opening 49.5 in the mounting bracket 49. A cam member 51 has a shaft 51.1 rotatable in the journal opening 49.5, has an eccentric cam part 51.2 (see FIG. 21) received in the adjusting member cam follower slot 50.3, and has retaining means 51.3 or the like securing the cam member shaft on the mounting bracket. With a pair of the adjusting fixtures 48 mounted on opposite sides of a connector 16 and with the member adjusting flanges 50.2 fitted into locating notches 46 on the connector contact strips 28.2, the connector is adapted to receive the edge 12.1 of a first daughter board 12 in the connector and to be secured to the connector 16 by mounting screws 52. The cam member 51 is then rotated as necessary so its eccentric cam slidably adjusts the relative position of the adjustable member 50 on the bracket 49 as may be necessary to move the adjustable member 50 against the notches 46 to move the contact strips 28.2 to align the contact member leaf springs 28.1 with respective terminal pads 22 on the first daughter board 12. The first daughter board 12 with its attached connector 16 and with its temporary adjusting fixtures 48 mounted thereon, is then processed by vapor phase soldering or in other conventional manner as indicated by the arrows 54 in FIG. 20 to solder the engaged portions of the leaf springs 28.1 to the terminal pads 22 on the first daughter board. The adjusting fixtures are then detached and the carrier strips 28.2 on the contact member strips 28a–28h are separated from the individual contact members for providing a precisely mounted and electrically interconnected first circuit board 16/connector 16 assembly.

Figure 10:
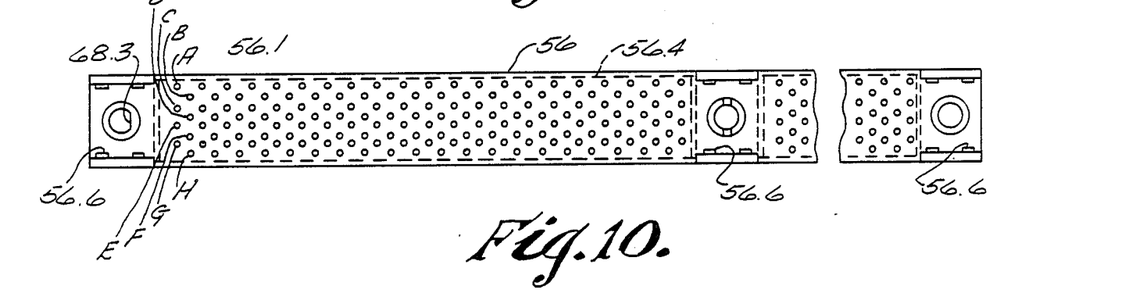
FIG. 10 is a plan view of the insulating body used in the second connector shown in FIG. 9.

Each of the second connectors 18 is preferably of the bottom-loaded type and, in accordance with this invention, each has a connector 56 of a material corresponding to connector body 24 having a plurality of openings 52.1 in the body arranged in a plurality of rows with spacings between the rows and between the openings in each row corresponding to the number of rows and the spacing of openings in connector body 24. Preferably where the connector body 24 has rows A–H spaced as described above, the connector body 56 has comparable rows also designated A–H as shown in FIG. 10. The connector body 56 has a top 56.2, a bottom 56.3, preferably a pair of shallow wells 56.4 in the bottom corresponding to the wells 24.5 in the connector body 24, and preferably has stand-offs 56.5 spaced along the bottom with shallow locating grooves 56.6 therein. The body has mounting holes 56.7 as shown in FIG. 19 with a relatively larger diameter portion 56.8 at the top end of each mounting hole.

Figure 12:
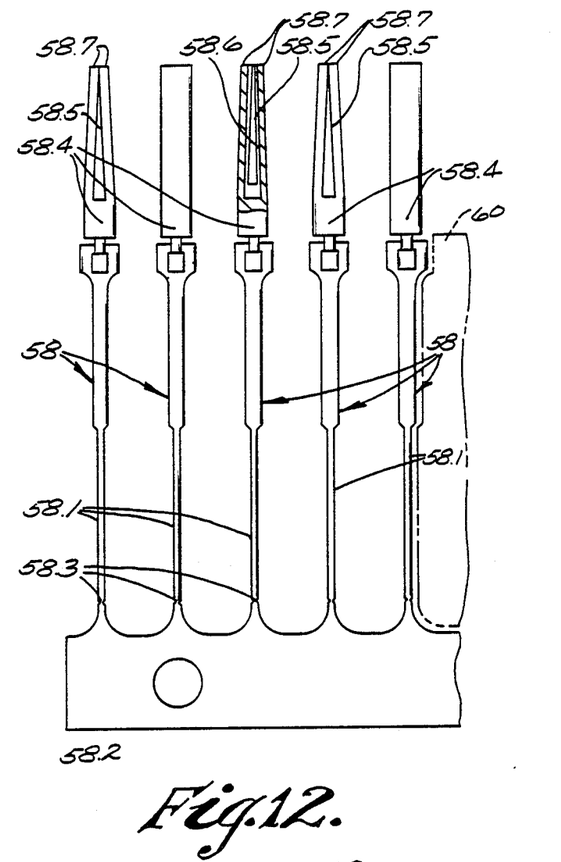
FIG. 12 is a partial front elevation view to greatly enlarged scale of a strip of contact members used in the connector of FIG. 9.
Figure 13:
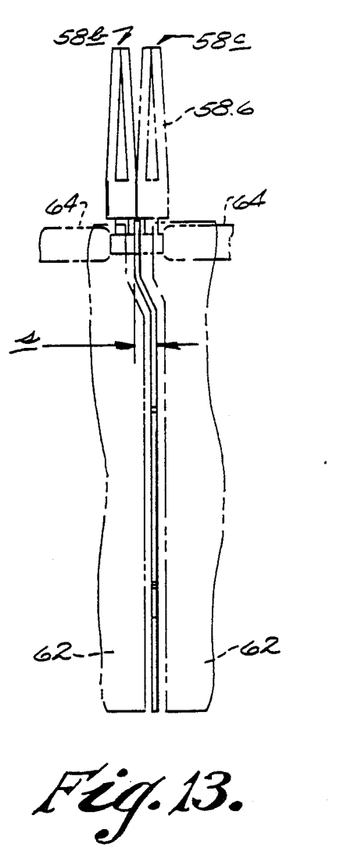
FIG. 13 is a side elevation view of the strip of contact members shown in FIG. 12.

A plurality of contact members 58 are mounted in the respective body openings 56.1 to form the mother board connector 18. In accordance with this invention, a plurality of the contact members 58 are formed in interconnected relation by blanking contact post portions 58.1 of the members from a strip of electrically conductive metal contact posts interconnected by a carrier portion 58.2 of the strip. The contact posts preferably have weakened portions 58.3 of relatively smaller cross section between the carrier strips in each post for permitting subsequent separation of the carrier strip from the posts as described below. Preferably the contact post ends are tapered at this weakened area to facilitate subsequent lead-in of the posts into openings as noted below. The blanking or etching or the like of the contact posts is carried out by any conventional means as is diagrammatically indicated by the broken lines 60 in FIG. 12 and the contact posts are then shaped any conventional means as is diagrammatically indicated by the broken lines 62 in FIG. 13 to provide the posts with selected offsets s. Spring means such as spring clips for engagement with the contact posts 28.4 of connector 16 are then provided on the respective contact posts 58.1 at ends thereof opposite the carrier strips 58.2. Preferably for example sleeves 58.4 of resilient electrically conductive spring material such as beryllium copper, phosphor bronze or the like have an axial slit 58.5 extending into an internal bore 58.6 and have wings 58.7 of the split sleeve deformed into the bore to receive and resiliently engage contact posts 28.4 therein. The split spring clip sleeves are welded or otherwise secured to the ends of the contact posts 58.1 by any conventional resistance welding means or the like as indicated by the broken lines 64 in FIG. 13. Preferably the spring clips are welded to one side of the contact posts in one set of the member strips 58a and to an opposite side of the contact posts for forming a second set of contact member strips 58b as indicated by the broken lines 58.8 in FIG. 13.

Figure 11:
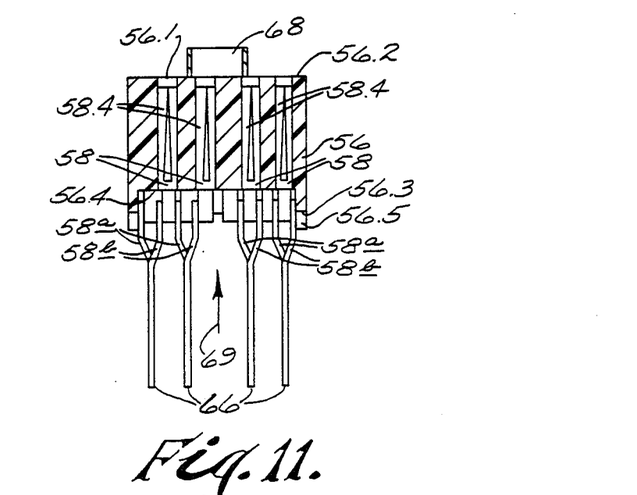
FIG. 11 is a section view along line 11—11 of FIG. 9.

The contact member strips 58a are then preferably bottom-loaded into the connector body 58 to dispose the spring clips thereof in the rows A, C, E and G of the body openings with 0.100 inch spacing between the centers of the spring clips while comparable contact member strips 58b are loaded into rows B, D, F, and H on corresponding 0.100 inch centers with an oppositely facing orientation such that the spring clips on the contact members are arranged in eight rows with 0.100 inch spacing between clips in each row while the contact posts of the members in pairs of rows A–B, C–D, E–F and G–H extend from the bottom of the connector body to be disposed in a lesser number of common rows 66 as shown in FIG. 11 with a spacing of 0.050 inches between adjacent contact posts in each of the common rows 66. Preferably an expoxy material is inserted into the wells 56.4 in the bottom of the connector body by any conventional means as indicated at 69 in FIG. 11 (while the body is inserted from the position shown in FIG. 11 as will be understood) for securing and sealing the contact members 58 in the respective connector body openings 56.1. The carrier strips 58.2 are then separated from the contact members by folding the carrier strips relative to the posts at the weakened portions 58.3 leaving the ends of the posts tapered as noted above as will be understood.

Figure 19:
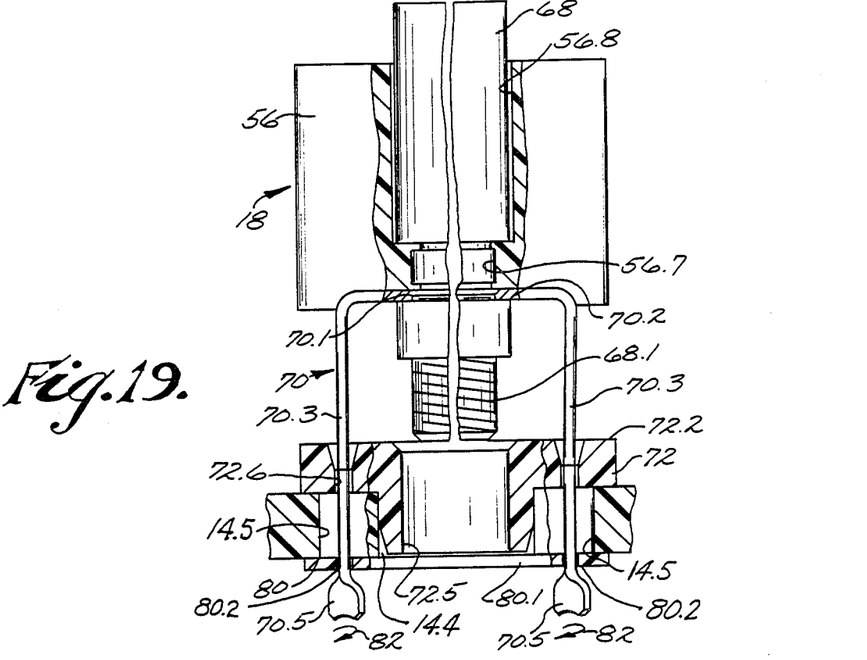
FIG. 19 is a section view along the transverse axis of the second connector shown in FIG. 17 illustrating a third step in assembly of the second connector in the system of FIG. 1.

In accordance with this invention, resilient mounting means and contact post organizing means are preferably provided in the connectors 18 to protect the connectors during handling, to facilitate mounting of the connectors on the mother board 20 to insert the contact post ends into the mother board apertures 20.1 in a reliable manner, to permit significant movement on the order of 0.020 inches of the daughter boards to left and right as viewed in FIG. 19 during inserting of the daughter boards into the heat rack tracks 20-3 to assure proper heat transfer to the rack and to prevent injury to the contact posts of the connector on the second circuit board.

Figure 16:
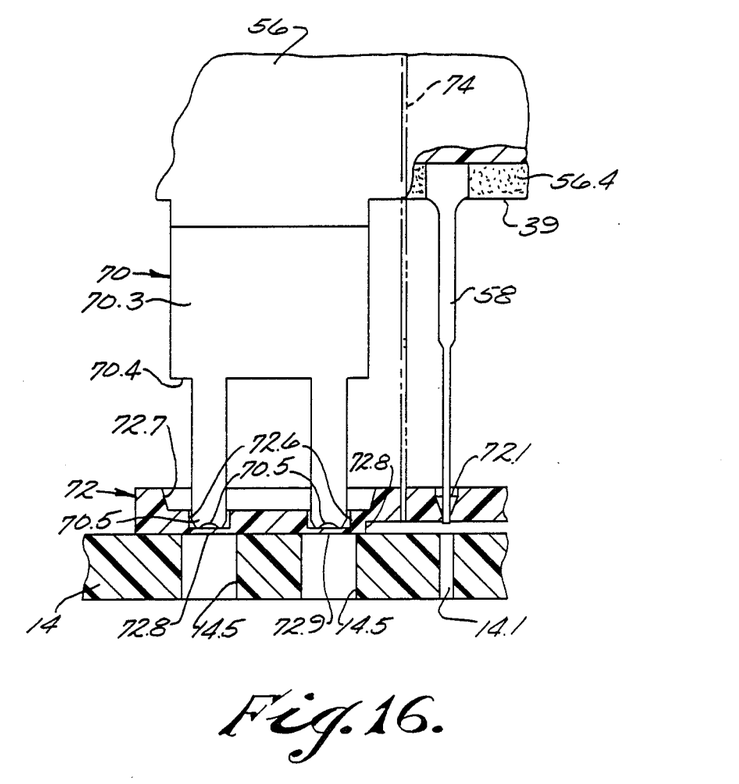
FIG. 16 is a partial side elevation view of the connector of FIG. 9 to greatly enlarged scale illustrating a feature of the connector of FIG. 9.

Preferably, for example, a plurality of resilient mounting means each comprise a U-shaped bridging element 70 having a mounting hole 70.1 in a base 70.2 and having a pair of legs 70.3 extending from the base. Stand-off means or shoulders 70.4 are provided on the legs at selected spacing from the base facing the distal ends 70.5 of the legs and the leg ends are preferably pointed as shown in FIG. 16, preferably with an arcuate shape to provide two sharp points spaced as shown. Guide sleeves 68 are fitted into the connector body mounting holes 56.8 while the bases of the U-shape bridging elements 70 are disposed in the shallow locating grooves 56.6 in the bottom of the connecor body so the threaded ends 68.1 of the guide sleeves extend through the mounting holes to be engaged by nut 68.2 for securing the bridging elements to the connector body.

Preferably an organizer plate 72 (of plastic material as indicated in FIG. 16) has a plurality of openings 72.1 therein arranged in a plurality of rows for receiving the respective connector contact posts 58.1 therein. The organizer plate openings are preferably flaired out at the top 72.2 of the plate to guide the contact post ends 58.1, tapered as noted above, into the openings as illustrated in FIG. 16. The organizer plate also has locating bosses 72.3 formed on the bottom 72.4 of the plate, has guide holes 72.5 in the bosses, and preferably has four mounting holes 72.6 formed in the plate in a recess 72.7 around each of the locating bosses, each mounting hole 72.6 preferably being initially closed by a very pierceable thin membrane 72.8 of the plate material recessed into the holes.

The organizer plate is positioned at the bottom of the connector 18 so that plate openings 72.1 receive and organize the relative location of distal ends of the connector contact posts 58.1 relative to each other and so that the pointed ends of the bridging element legs 70 are temporarily received on the membranes 72.8 in the respective mounting holes in the plate. If desired a rubber band means 74 or the like detachably attaches the organizer plate to the connector 18. In that way, the organizer plate serves to protect the contact posts 58.1 during handling of the connector.

In a preferred embodiment, temporary feeler means 76 are mounted on the connector 18. That is, the feeler means each have a feeler arm 76.1 threadedly attached to the threaded end 68.1 of the guide sleeves in the connector 18 as shown in FIG. 19 to extend from the bottom of the connector and through the mounting holes 72.5 in the organizer plate to dispose a feeler head 76.2 at a spaced location from the connector 18. Preferably coil spring means 76.3 are disposed around each feeler arm between the feeler head and the bottom of the organizer plate and thereby serve to hold the organizer plate against the ends 70.5 of the legs of the resilient mounting means 70.

In a preferred embodiment of this invention, the contact member posts 58.1 in the connectors 18 have extensions from the connector body 56 which are very long relative to the cross sectional dimensions of the contact points. Preferably the contact post 58.1 has a length or extension which is at least ten times greater than the smallest cross sectional dimension of the contact posts and preferably where the posts are very small cross section of 0.010 inches by 0.005 inches for example, the contact post extension is on the order of 20 times greater than the smallest cross section dimension. Preferably also the contact post material is subjected to a heat treatment, at an appropriate stage in forming the contact members for placing the contact post material in less than about one quarter of full work hardened condition. In that arrangement, the contact posts 58.1 have substantial pliability to facilitate mounting of the connector 18 on the second circuit board while avoiding damage to the contact post elements.

Figure 14:
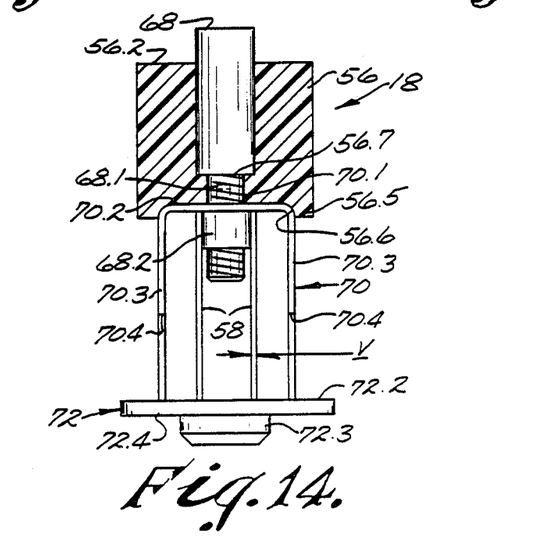
FIG. 14 is a section view along line 14—14 of FIG. 9.
Figure 15:
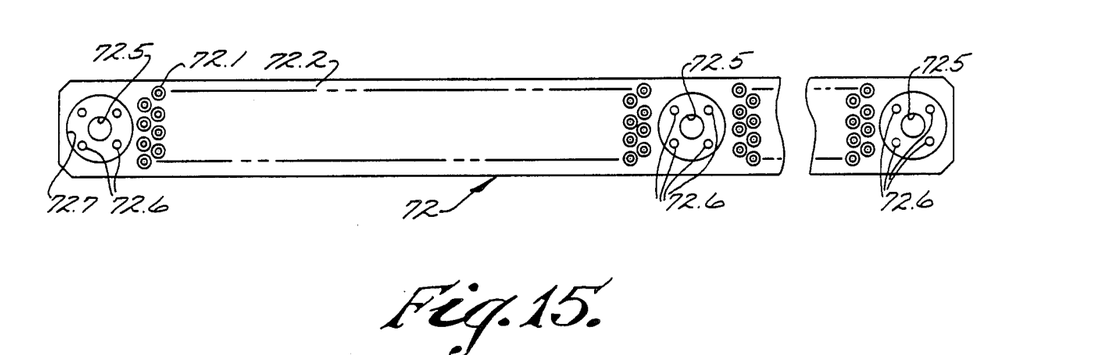
FIG. 15 is a plan view of a component of the connector shown in FIG. 9.
Figure 17:
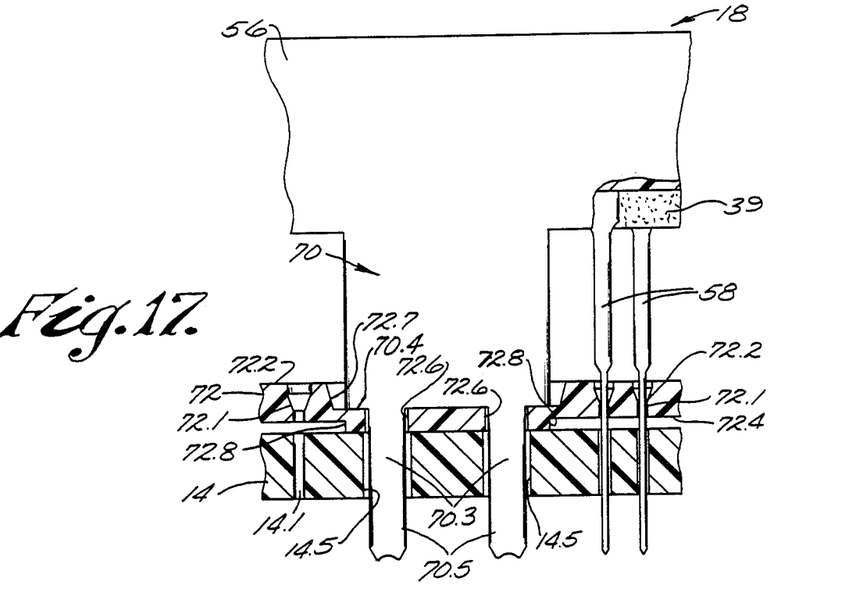
FIG. 17 is a partial side elevation view similar to FIG. 16 illustrating a step in the assembly of the second connector in the system of FIG. 1.
Figure 18:
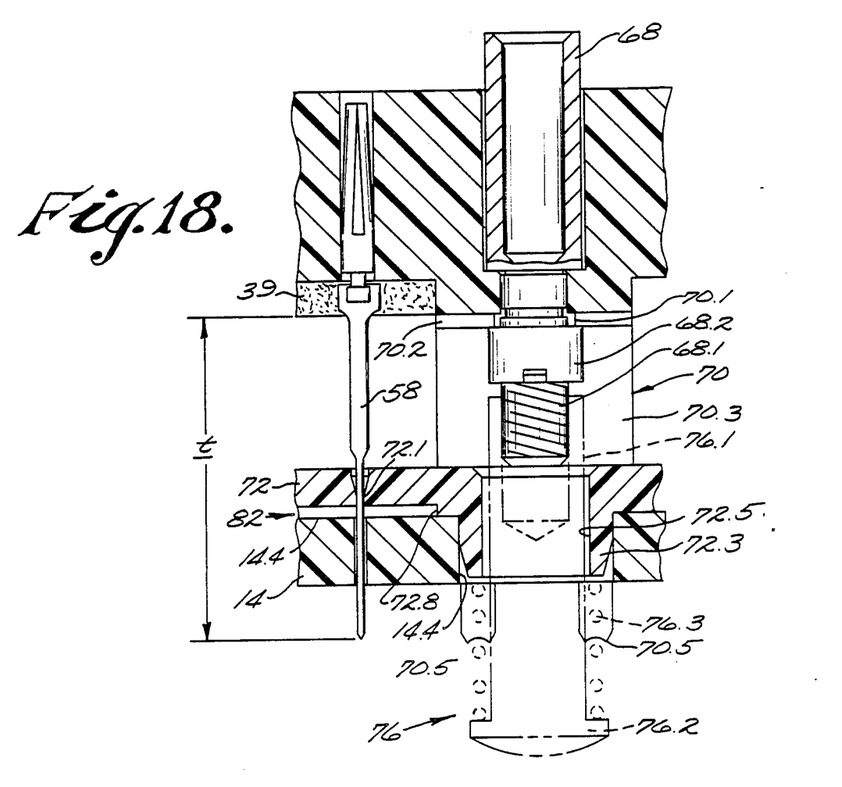
FIG. 18 is a section view along the longitudinal axis of the second connector shown in FIG. 17 illustrating a second step in assembly of the second connector in the system of FIG. 1.

In this arrangement, the connectors 18, with the mounting means 70 and organizer plate 72 in their initial position relative to the connector 18 as shown in FIGS. 14 and 16 and with the feeler means 76 attached as shown in FIG. 18, are adapted to be reliably mounted on the second circuit board in a convenient manner with very high interconnection density. That is, with the organizer plate 72 held on the connector by the feeler means for example, the feeler heads 76.2 on the connectors are advanced into the mounting holes 14.4 on the second circuit board. As the feeler heads are advanced into those holes, the organizer plate locating bosses 72.3 are then received in those mounting holes as the connector is advanced for properly aligning the distal ends of each connector contact member post 58.1 with an appropriate aperture 14.1 in the second circuit board. The connector body 56 is then pressed firmly down for piercing the membranes 72.8 in the organizer plate mounting holes with the pointed legs of the bridging element 70, whereby the element legs then fit into the mounting holes 14.5 in the second circuit board to the point where the stand-off means 70.4 on the mounting legs engage the organizer plate 72 and cooperate with the stand-off means 72.8 on the organizer plate to space the connector 18 at a substantial spacing above the circuit board 14 as shown in FIGS. 17 and 18. At that point a locking or clamping plate 80 having an opening 80.1 to fit over the feeler arms and having mounting slots 80.2 is fitted over the legs of the resilient mounting bridge 70 and the legs 70.3 are twisted by any convenient means as indicated by the arrow 82 in FIG. 19 for securing the connector 18 to the second circuit board. In that arrangement, solder is then provided at junctions of the contact posts 58.1 and circuit paths 14.3 in any conventional manner as is diagrammatically indicated by the arrows 84 in FIG. 18 for soldering the contact posts to the desired circuit paths 14.4 on the second circuit board. Preferably the organizer plate has stand-offs 72.8 as shown in FIGS. 16-18 to facilitate flushing of solder flux from between the plate and circuit board during the soldering process. The temporary feeler means 76 are then threadedly detached from the guide sleeves and removed from the system.

In accordance with this invention, the daughter board connectors 16 with first circuit board units mounted thereon as described above are then mated with respective second connectors 18 mounted on the second circuit board. In that mating, the guide pin 42 on the first connectors are initially received in the guide sleeves 68 on the second connectors and the guide sleeves are then received in the larger diameter parts 42.2 of the guide openings in the first connectors for precisely positioning the pairs of connectors relative to each other with the contact posts 28.1 of the first connector disposed in secure electrical engagement to the contacts 58 in the second connector within the spring clips thereof. It will be noted that the guide sleeves are easily interchanged by removal of the nuts 68.2 for interchanging polarity of the connectors if desired.

In that arrangement each of the connectors 16 and 18 is characterized by a structure which permits the connectors to be easily manufactured and assembled. The connector bodies have openings therein which are compactly spaced relative to each other to receive the connector contact members from the noted contact member strips in a convenient and reliable way in assembling the connector. The connector contacts have substantial spacing between the leaf springs thereof for permitting easy blanking and forming of the strips and to permit welding of other components of the contact members to the blank strips in a convenient manner. The welded contact member contructions permit the members to combine desirable spring, strength and size properties permitting the contact members to be a very small size and to be compactly accommodated in large numbers in resilient engagement with first circuit board terminal pads or in second circuit board mounting apertures. The welded contacts also permit the contact members to easily and reliably received in a compact manner in large numbers within the connector body openings. The first or daughter board connectors are adapted to be precisely positioned and soldered to terminal pads on the first circuit board units with high reliability and reproducibility even though the leaf spring connector means in those connectors have center-to-center spacings on the order of 0.025 inches. Similarly, the second or mother board connectors are also adapted to be precisely positioned and soldered to circuit pads on the mother board with high reliability and reproducibility and the mounting posts apertures in the mother board are adapted to be rectilinearly disposed in ranks and rows to facilitate circuit path mounting thereon even though a very large number of contact posts are accommodated in circuit board apertures in a compact manner. The second connectors are provided with compact resilient mounting means on the second circuit board to protect the contact post of the connector and the soldered connections of said posts to the second circuit board during mounting of the first connectors on the second connectors. The contact posts themselves have novel extension and material condition properties enhancing pliability of the contact posts to permit and facilitate the use of such resilient mounting while avoiding damage to the contact member posts during assembly or use.

It should be understood that although preferred embodiments of the connectors, systems and methods of this invention have been described by way of illustrating the invention, the invention includes all modification and equivalents of the described embodiments following within the scope of the appended claims

We claim:

1. An edgeboard connector comprising a body of electrical insulating material having plurality of openings extending through the body from a top to a bottom of the body, said openings being arranged in a compact group having a plurality of contact members disposed in the respective openings, said group of openings being arranged in at least three rows extending in side-by-side parallel relation to each other along a length of the body with a first, uniform, center-to-center spacing between adjacent openings in each row, with uniform spacing between at least one row of openings and at least another of the rows of openings on each of two sides of said one row, and with the openings in alternate rows offset along the length of the body by one-half of said first center-to-center spacing relative to corresponding openings in adajcent rows to provide the body openings with a uniform center-to-center spacing relative to each other greater than the spacing between the rows of openings and greater than one-half the center-to-center spacing between openings in each row to accommodate the contact members in said openings with relatively wide, uniform, center-to-center spacing between the contact members in said openings, the contact members each having a rigid contact post formed of a rigid electrically conductive metal material and having at leaf formed of a relatively more resilient electrically conductive metal strip material welded to portions of the contact post, the contact members being disposed in said respective body openings with said welded portions of the contact members accommodated at said spaced body openings, having the electrically conductive contact posts extending at one end from said respective body openings at the bottom of the body in said rows for electrically engaging respective mating connectors having contact members arranged in corresponding rows, and having said resilient electrically conductive leaf springs extending from the openings in the group at the top of the body and having at least some of the leaf springs having bends therein cooperating with the spacing of said group of openings to be disposed in a common row extending along the length of the body with a center-to-center spacing between the leaf springs in the common row which is uniform and relatively much smaller than said relatively wide center-to-center spacing of the contact members in the group of body openings for resiliently electrically engaging respective terminal pads closely spaced in a row on one side of a printed circuit board adjacent an edge of the board.

2. An edgeboard connector according to claim 1 having carrier strip means interconnecting distal ends of the leaf springs extending from each row of body openings in said group, the carrier strip means extending in parallel relation to each other along the length of the body and having means for moving the carrier strips along the length of the body relative to each other for adjusting spacings between leaf springs in said common row and for adjusting positioning of the leaf springs relative to the connector body.

3. An edgeboard connector according to claim 2 having means for attaching the body to a printed circuit board and wherein said moving means comprise locating notches in said carrier strip means to be aligned relative to each other for providing said center-to-center spacing between the leaf springs in said common row and for facilitating moving of the leaf springs to align the leaf springs with respective terminal pads on the printed circuit board.

4. An edgeboard connector according to claim 3 having a fixture detachably attached to the body and having adjustable means on said fixture engaged with said locating notches to selectively move the leaf springs to align the leaf springs with respective terminal pads on the printed circuit board for permitting soldering of the contact portions of the leaf springs to the respective pads and subsequent detachment of the fixture from the body.

5. An edgeboard connector according to claim 4 wherein the leaf springs have weakened portions therein intermediate said carrier strip means and said contact portions of the leaf springs to facilitate separating of the carrier strip means from the leaf springs after soldering of the contact portions of the leaf springs to respective terminal pads on the circuit board.

6. A connector comprising a body of electrical insulating material having a plurality of openings extending through the body from a top to a bottom of the body, said openings being arranged in a compact group and having a plurality of contact members disposed in the respective openings, said group of openings being arranged in at least three rows extending in side-by-side parallel relation to each other along a length of the body with a first, uniform, center-to-center spacing between adjacent openings in each row, with uniform spacing between at least one of the rows of openings and at least another row of openings on each of two sides of said one row, and with the openings in alternate rows offset along the length of the body by one-half of said first center-to-center spacing relative to corresponding openings in adjacent rows to provide the body openings with a uniform center-to-center spacing relative to each other greater than the spacing between the rows of openings and greater than one-half the center-to-center spacing between openings in each row to accommodate the contact members in the respective openings with relatively wide, uniform center-to-center spacing between the contact members, the contact members each having a resilient spring contact means of substantial size at one end having a portion thereof welded to an electrically conductive contact post of strip metal material, said welded portions of the contact members being accommodated with said relatively wide center-to-center spacings in the body openings and having the posts thereof extending from the bottom of the body in a relatively lesser number of other rows with a second, relatively smaller center-to-center spacing between the contact posts in said other rows, the other rows of said contact posts being free of said offset relative to posts in adjacent ones of said other rows so that ranks of said contact posts are rectilinearly arranged relative to the other rows to be received in corresponding, rectilinearly arranged rows and ranks of apertures in a printed circuit board, thereby to facilitate accommodating of circuit paths in the circuit board between said ranks and rows of apertures for electrically interconnecting the contact posts in a selected electrical circuit.

7. A connector comprising a body having a plurality of openings extending through the body from a top to a bottom of the body, mounting means for resiliently mounting the body on a printed circuit board to permit selected resilient movement of the body relative to the printed circuit board, and a plurality of contact members disposed in the respective body openings having electrically conductive metal contact posts at one end extending from the bottom of the body to be electrically connected to circuit paths on the printed circuit board, the mounting means having stand-off means cooperating therewith for engaging the printed circuit board to dispose the bottom of the body in a selected substantial distance from the print circuit board, and the contact posts having a length-to-cross section ratio across said substantial distance selected for permitted said selected resilient movement of the body with fracturing of the contact posts.

8. A connector according to claim 7 wherein the electrically conductive metal contact posts are in a relatively soft condition of work hardening for facilitating flexing of the contact posts during said selected resilient movement of the body without fracturing of the contact posts.

9. A connector according to claim 7 having an organizer plate with a plurality of openings therein fitted over the respective contact posts at the distal ends thereof for facilitating alignment of said post ends with respective apertures in a printed circuit board during mounting of the connector on the printed circuit board.

10. A connector according to claim 7 wherin the resilient mounting means comprises a plurality of resilient U-shaped bridge elements secured in spaced relation to each other on the connector body, each bridging element having a base secured to the bottom of the body and having a pair of legs extending from the base with distal ends thereof adapted to be secured to the printed circuit board for permitting flexing of the legs during said selected resilient movement of the body relative to the printed circuit board.

11. A connector comprising a body of electrical insulating material having a plurality of openings extending through the body from a top to a bottom of the body in a plurality of rows extending in side-by-side parallel relation to each other along a length of the body with a first center-to-center spacing between adjacent openings in each row, with selected spacing between the rows of openings, and with the openings in alternate rows offset along the length of the body by one-half of said first center-to-center spacing relative to corresponding openings in an adjacent row, mounting means for resiliently mounting the body on a printed circuit board to permit selected resilient movement of the body relative to the printed circuit boad, and a plurality of contact members disposed in the respective openings having electrically conductive metal contact posts at one end extending from a bottom of the body in a relatively lesser number of other rows with a second, relatively smaller center-to-center spacing between the contact posts in said other rows, the other rows of said contact posts being disposed so that the contact posts are rectilinearly arranged relative to the contact posts in other rows to be received in corresponding rectilinearly arranged rows and ranks of apertures in a printed circuit board, the mounting means having stand-off means for engaging the printed circuit board to dispose the bottom of the body at a selected substantial distance from the printed circuit board, and the contact posts having a length-to-cross section ratio across said substantial distance for permitting said selected resilient movement of the body without fracturing of the contact posts, the mounting means including an organizer plate having a plurality of openings therein fitted over to the respective contact posts at the distal ends thereof for facilitating alignment of the post ends with respective apertures in the print circuit board during mounting of the connector on the circuit board.

12. A connector according to claim 11 wherein the resilient mounting means comprises a plurality of resilient U-shaped bridging elements secured in spaced relation to each other on the connector body, each element having a base secured to the bottom of the body and having a pair of legs extending from the base with distal ends thereof adapted to be secured to the printed circuit board for permitting flexing of the legs during said selected resilient movement of the connector body relative to the printed circuit board.

13. A connector according to claim 12 wherein the distal ends of the legs of the bridge elements are adapted to extend through the holes in the printed circuit board and to be twisted therein for securing the bridge elements to the printed circuit board.

14. A connector according to claim 12 wherein the legs of the briding elements are pointed at their distal ends and have shoulders selectively spaced from the distal ends thereof facing towards the distal ends, and the organizer plate has relatively thin membranes of the plate material bearing against said pointed leg ends for normally disposing the organizer plate openings at the distal ends of said contact posts and for selectively permitting the bridging element legs to pierce the thin membranes of the organizer plate and engage said shoulders with the organizer plate, the organizer plate having locating means thereon to be engaged with corresponding locating means on a printed circuit board for aligning the contact posts with respective apertures in the printed circuit board and thereafter permitting the connector to be pressed toward the printed circuit board for piercing said thin organizer plate membranes with the bridging element legs to insert the contact posts to a selected extent into the printed circuit board apertures.

15. A connector according to claim 14 wherein the organizer plate openings taper to provide relatively large openings facing the bottom of the connector body for receiving and guiding the contact posts into said plate openings.

16. A connector acording to claim 14 wherein the organizer plate has stand-off means for engaging the printed circuit board to permit flushing of solder flux from between the plate and printed circuit board.

17. A connector comprising a body having a plurality of openings extending through the body from a top to a bottom of the body, a plurality of contact members disposed in the respective body openings having electrically conductive metal contact posts at one end extending from the bottom of the body to fit into respective apertures on a printed circuit board to be electrically connected to circuit paths on the circuit board, means for securing the connector body to the printed circuit board including screw thread means accessible from the bottom of the body, and a plurality of feeler means having one end threadedly engaging said screw thread means and having opposite ends extending from the bottom of the body to be inserted into corresponding guide holes in the printed circuit board for aligning the contact posts with said respective circuit board apertures, the feeler means being detachable from the screw thread means after insertion of contact posts in said circuit board apertures.

18. A system comprising a first circuit board having a row of terminal pads spaced along an edge thereof, a second circuit board having apertures arranged in a plurality of rows with corresponding apertures in adjacent rows disposed in ranks which extend rectilinearly relative to said rows, the second circuit board having circuit paths accommodated thereon to extend between said ranks and rows of apertures, a first connector having means for resiliently engaging the terminal pads to be soldered to said respective pads, and a second connector having contact posts received in said respective apertures to be soldered to said circuit paths, the first and second connectors being detachably connected for electrically connecting the terminal pads to the circuit paths characterized in that the first connector has a first body with a plurality of openings extending through the body arranged in a group and having a plurality of first contact members disposed in the respective openings, said openings being arranged in at least three rows extending in side-by-side parallel relation to each other along a length of the first body with a first, uniform, center-to-center spacing between adjacent openings in each row, with selected spacing between one of the rows of said openings and at least another row of said openings on each of two sides of said one row, and with said openings in alternate rows offset along a length of the first body by one-half said first center-to-spacing relative to corresponding openings of the group in an adjacent row to provide said first body openings with a uniform center-to-center spacing relative to each adjacent first body opening greater than the spacing between rows of openings in the group and greater than one-half the center-to-center spacing between openings of the group in each row to accommodate the first contact members in said openings with relatively wide, uniform center-to-center spacing between the first contact members in said first body openings, the first contact members each having a rigid contact post formed of a rigid electrically conductive metal material and having a leaf spring formed of a relatively more resilient electrically conductive metal strip material welded to portions of the contact post, the first contact members being disposed in said respective first body openings with said relatively wide spacing between the first contact members to accommodate said welded portions thereof on the first body, with the electrically conductive contact posts extending from a bottom of the first body in corresponding rows, with the resilient electrically conductive leaf springs extending from a top of the first body and having at least some of said leaf springs with bends therein cooperating with the spacing of said first body openings to be formed into a common row extending along the length of the first body, and with a center-to-center spacing between the leaf springs in the said common row which is uniform and relatively much smaller than said relatively wide center-to-center spacing of the first contact members in said first body openings, and the second connector has a second body with a corresponding group of openings in corresponding rows having the same center-to-center spacing as the group of first body openings and having a plurality of second contact members disposed in the respective openings of said corresponding group, the second contact members each having a spring clip of resilient electrically conductive material and having a post of electrically conductive metal strip material welded to portions of the spring clip, the second contact members being disposed in said respective second body openings with said relatively wide spacing between the second contact members to accommodate said welded portions thereof on the second body, with the resilient electrically conductive spring clips disposed at a top of the second body detachably receiving the respective contact posts of the first contact members therein, and with the electrically conductive posts of the second contact members extending from a bottom of the second body and cooperating with the spacing of said second body openings to be formed into a relatively smaller number of rows than said rows of openings to be received in respective apertures in the second circuit board to be soldered to circuit paths thereon, whereby terminal pads arranged in close center-to-center relation in a first configuration on the first circuit board are detachably electrically connected to circuit paths arranged in close center-to-center relation in a second configuration on the second circuit board with improved interconnection line density by detachable interconnection of welded contact portions arranged in relatively more widely spaced center-to-center relation in another configuration for also providing improved detachable electrical connection between the terminal pads and circuit paths.

19. A system according to claim 18 wherein mounting means resiliently mount the second connector body on the second circuit board to permit selected resilient movement of the second connector body relative to the second circuit board, the mounting means have standoff means cooperating therewith for engaging the second circuit board to dispose the bottom of the second connector body at a selected substantial distance from the second circuit board, and the contact posts on the second contact members have a length-to-cross section ratio across said substantial distance selected for permitting said selected resilient movement of the second connector body without fracturing of said contact posts.

20. A system according to claim 19 wherein the electrically conductive metal contact posts of said second contact members are in relatively soft condition for facilitating flexing thereof during said selected resilient movement.

21. A system according to claim 20 having an organizer plate with a plurality of openings therein fitted over the respective contact posts of the second contact member at the distal ends thereof, the organizer plate being secured to the second connector body for shielding the second contact members as said distal ends.

22. A system according to claim 21 wherein said mounting means comprises a plurality of resilient U-shaped bridging elements secured in spaced relation to each other on the second connector body, each element having a base secured to the bottom of the second connector body having a pair of legs extending from the base and secured to the second circuit board to permit flexing of aid legs during said selected resilient movement.

23. A method for mounting an edgeboard connector on a circuit board comprising the steps of
providing a body having a plurality of openings arranged in a plurality of rows extending in spaced side-by-side relation to each other along a length of the body with a first center-to-center spacing between adjacent openings in each row with alternate rows of the openings offset along the length of the body by a portion of said first center-to-center spacing relative to corresponding openings in adjacent rows,
providing a plurality of groups of contact members having first leaf spring connection means at one end and second connection means at an opposite end and having carrier strip means interconnecting the distal ends of the leaf springs in each group with each other with said first center-to-center spacing therebetween, at least some of said groups of contact members having a selected offset intermediate the ends of each member in the group in a plane normal to said carrier strip means,
disposing the contact members in each of said groups in respective openings of a respective one of said rows of body openings with said leaf springs extending from said plurality of rows of openings interfitted with each other to form a common row with a second relatively smaller center-to-center spacing between the leaf springs in the common row,
securing a circuit board having a plurality of terminal pads spaced with said second relatively smaller center-to-center spacing therebetween to the body,
selectively moving the carrier strip means of said contact member groups to align the leaf springs thereof in resilient engagement with the respective terminal pads on the circuit board,
soldering the leaf springs to the respective terminal pads, and
separating the carrier strip means from the groups of contact members,
wherein notch means are provided in said carrier strip means, an adjusting bracket is detachably attached to the connector body, and an adjusting cam means is movably mounted on the bracket engaged with said notch means and is moved on the bracket for selectively positioning the leaf springs with said respective terminal pads prior to said soldering, the adjusting bracket and cam means being subsequently detached from the connector body after said soldering.

24. A method for mounting a connector on a circuit board comprising the steps of
- providing a body having a plurality of openings arranged in at least one row along a bottom of the body, the body having stand-off means spaced at the bottom of the body,
- disposing contact means in the openings with connection means thereof extending from the openings at the bottom of the body in at least one row with selected spacing therebetween,
- providing an organizer plate having a plurality of openings therein arranged in at least one row with said selected spacing therebetween,
- attaching the organizer plate to the stand-off means for movement relative to the body to receive the distal ends of the contact member connection means within the organizer plate openings for positioning the distal ends relative to each other,
- positioning the organizer plate relative to a circuit board to align the organizer plate openings with respective apertures on the circuit board, and
- moving the body relative to the organizer plate to insert the contact member connection means into the respective circuit board apertures.

25. A method according to claim 24 wherein the organizer plate has piercable portions aligned with said stand-off means and the body is moved relative to the organizer plate for piercing said piercable portions of the organizer plate.

26. A method for electrically interconnecting terminal pads on a first circuit board paths associated with mounting apertures in a second circuit board comprising the steps of
- providing a first body having a plurality of openings arranged in a plurality of rows extending in spaced side-by-side relation to each other along a length of the body with a first center-to-center spacing between adjacent openings in each row and with alternate rows of the openings offset along the length of the body by a portion of said first center-to-center spacing relative to corresponding openings in adjacent rows,
- providing a plurality of groups of first contact members having first leaf spring connection means at one end and second connection means at an opposite end and having carrier strip means interconnecting the distal ends of the leaf springs in each group with each other with said first center-to-center spacing therebetween, at least some of said groups of first contact members having a selected offset intermediate the ends of each member in the group in a plane normal to said carrier strip means,
- disposing the contact members in each of said groups in respective openings of a respective one of said rows of openings in the first body with said leaf springs extending from said plurality of rows of openings at one side of the body interfitted with each other to form a common row with a second relatively smaller center-to-center spacing between the leaf springs in the common row and with said second connection means extending from an opposite side of the first body,
- securing a first circuit board having a plurality of terminal pads spaced with said second relatively smaller center-to-center spacing therebetween to the first body,
- selectively moving the carrier strip means of said contact member groups to align the leaf springs thereof in resilient engagement with the respective terminal pads on the circuit board,
- soldering the leaf springs to the respective terminal pads,
- separating the carrier strip means from the groups of first contact members,
- providing a second body having a plurality of openings arranged in at least one row along a bottom of the second body, the second body having stand-off means spaced at a bottom of the second body,
- disposing second contact members in the openings in the second body with first connection means thereof in the openings and with second connection means thereof extending from the openings at the bottom of the second body in at least one row with predetermined spacing therebetween,
- providing an organizer plate having a plurality of openings therein arranged in at least one row with said predetermined spacing therebetween,
- attaching the organizer plate to the stand-off means for movement relative to the second body to receive the distal ends of the second connection means of the second contact members within the organizer plate openings for positioning the distal ends thereof relative to each other,
- positioning the organizer plate relative to a second circuit board to align the organizer plate openings with respective apertures on the second circuit board,
- moving the second body relative to the organizer plate to insert the second connection means or the second contact members into the respective circuit board apertures,
- soldering the second connection means of the second contact members to circuit paths on the second circuit board, and
- detachably connecting the second connection means of the first contact members with the first connection means of the second contact members.

* * * * *